US006396355B1

(12) United States Patent
Rezin

(10) Patent No.: US 6,396,355 B1
(45) Date of Patent: May 28, 2002

(54) SIGNAL GENERATOR HAVING FINE RESOLUTION AND LOW PHASE NOISE

(75) Inventor: Phillip J. Rezin, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 09/547,508

(22) Filed: Apr. 12, 2000

(51) Int. Cl.[7] .............. H03L 7/06; H03L 7/16; H03C 3/00; H04L 27/12; H04L 27/20
(52) U.S. Cl. ................ 331/18; 331/16; 331/17; 331/23; 327/156; 332/100; 332/103; 375/303; 375/309; 375/376
(58) Field of Search ............. 331/1 A, 16, 17, 331/18, 25, 23; 327/156–159; 375/376, 302–308; 360/57; 455/260; 332/100–105

(56) References Cited

U.S. PATENT DOCUMENTS

| | | | | |
|---|---|---|---|---|
| 3,810,046 A | * | 5/1974 | Lance ..................... 332/19 |
| 4,426,627 A | * | 1/1984 | Yoshisato et al. ......... 331/12 |
| 4,486,717 A | * | 12/1984 | Yamasaki ................. 331/4 |
| 4,614,917 A | * | 9/1986 | Zelitzki et al. .......... 331/1 A |
| 4,791,387 A | * | 12/1988 | Hasegawa et al. .......... 331/2 |
| 4,882,549 A | * | 11/1989 | Galani et al. ............ 331/14 |
| 4,965,531 A |  | 10/1990 | Riley |
| 5,015,971 A | * | 5/1991 | Taylor et al. ............ 331/16 |
| 5,097,230 A | * | 3/1992 | Lautzenhiser ............ 332/127 |
| 5,373,256 A | * | 12/1994 | Nicotra et al. ........... 331/2 |
| 5,414,741 A | * | 5/1995 | Johnson ................. 375/376 |
| 5,416,803 A | * | 5/1995 | Janer ................... 375/324 |
| 5,420,545 A | * | 5/1995 | Davis et al. ............ 331/17 |
| 5,428,361 A | * | 6/1995 | Hightower et al. ....... 342/201 |
| 5,440,275 A | * | 8/1995 | Erb et al. .............. 331/4 |
| 5,604,468 A | * | 2/1997 | Gilling ................ 331/176 |
| 5,712,602 A | * | 1/1998 | Suematsu ............... 332/127 |
| 5,721,514 A | * | 2/1998 | Crockett et al. ......... 331/3 |
| 5,748,047 A | * | 5/1998 | Guthrie et al. ......... 331/19 |
| 5,825,257 A | * | 10/1998 | Klymyshyn et al. ...... 332/100 |
| 5,834,987 A | * | 11/1998 | Dent ................... 332/127 |
| 5,903,194 A | * | 5/1999 | Opsahl et al. .......... 331/1 A |
| 5,987,089 A |  | 11/1999 | Hawkins, Jr. |
| 6,018,275 A | * | 1/2000 | Perrett et al. .......... 332/127 |
| 6,157,271 A | * | 12/2000 | Black et al. ........... 332/127 |

OTHER PUBLICATIONS

Phillip J. Rezin, "Microwave Synthesizer Meets Demanding Communications Requirements", Microwaves & RF, Mar. 2000, pp. 63, 64, 66, 68, 71, and 72.

* cited by examiner

Primary Examiner—David Mis
(74) Attorney, Agent, or Firm—Nathan O. Jensen; Kyle Eppele

(57) ABSTRACT

A signal generator includes an oscillator, a phase locked loop and a fractional divider. The oscillator is configured to provide an output signal. The phase locked loop is configured to receive the output signal and to provide a tuning signal to the oscillator. The phase locked loop has a phase detector configured to receive the output signal, to compare the output signal to a reference signal, and to provide the tuning signal to the oscillator based on the comparison. The fractional divider is outside of the phase locked loop and is configured to generate the reference signal.

33 Claims, 11 Drawing Sheets

SIGNAL GENERATOR HAVING FINE RESOLUTION AND LOW PHASE NOISE

FIELD OF THE INVENTION

The present invention relates generally to the field of signal generators. More specifically, the present invention relates to signal generators having a phase locked loop (PLL) to tune the output signal of the signal generator.

BACKGROUND OF THE INVENTION

The successful operation of modern wireless communication systems depends on the ability to produce high data rate analog and digital modulation at high frequencies (e.g., in the Gigahertz range). Meeting the needs of complex, wideband, high data rate systems requires signal generators with fine tuning capabilities and very low phase noise.

Typically, high frequency signal generators employ phase locked loops (PLLs) to stabilize the output signal. The output signal is down converted in the PLL using a digital divider to enable the use of lower frequency circuit components for phase locking the output signal to a tuning signal. The use of digital dividers to down convert the output signal suffers from the limitation that excess phase noise is introduced in the output signal. This phase noise is introduced by a factor of 20 log(N), where N is the division ratio of the digital divider.

One proposed solution to the challenge of reducing phase noise is the use of a harmonic or comb frequency generator and microwave mixer for frequency down conversion. A comb frequency generator produces a plurality of harmonics of a lower frequency (e.g., 100 MHz). An oscillator is mixed with one of the higher harmonics of the comb (e.g., 18 GHz) to produce a lower frequency output to be used in a PLL. However, this method suffers from numerous limitations. First, the comb frequency generator may introduce aliasing, making it difficult to extract the tuning signal. Second, it is generally necessary to offset the tuning signal from the comb frequency lines to provide finer tuning, which requires additional PLLs to tune within the comb frequencies (i.e., between 100 MHz "tongs"). Additional PLLs are expensive and complex, requiring additional microwave circuitry and shielding.

Thus, there is a need for an improved signal generator having low phase noise. There is further a need for an improved microwave signal generator that does not require the use of multiple PLLs. Further still, there is a need for a microwave signal generator having fine tuning capabilities and low phase noise with a minimal number of microwave circuits.

SUMMARY OF THE INVENTION

According to an exemplary embodiment, a signal generator includes an oscillator, a phase locked loop and a fractional divider. The oscillator is configured to provide an output signal. The phase locked loop is configured to receive the output signal and to provide a tuning signal to the oscillator. The phase locked loop has a phase detector configured to receive the output signal, to compare the output signal to a reference signal, and to provide the tuning signal to the oscillator based on the comparison. The fractional divider is outside of the phase locked loop and is configured to generate the reference signal.

According to an alternative embodiment, a microwave signal generator includes an oscillator configured to provide a microwave output signal. The signal generator further includes a phase locked loop configured to receive the microwave output signal and to provide a tuning signal to the oscillator. The phase locked loop includes a programmable frequency divider configured to receive the microwave output signal and a control signal, to select one of a plurality of division ratios based on the control signal, and to generate a divided output signal based on the selected division ratio. The phase locked loop further includes a phase detector configured to receive the divided output signal and a reference signal, to compare the divided output signal to the reference signal, and to provide the tuning signal to the oscillator based on the comparison.

According to yet another alternative embodiment, a signal generator includes a means for providing an output signal, a means for dividing the output signal based on a control signal, a means for generating a reference signal, a means for generating a tuning signal based on the divided output signal and the reference signal, and a means for tuning the output signal based on the tuning signal.

According to still another alternative embodiment, a method includes generating an output signal, dividing the output signal based on a control signal, generating a reference signal, generating a tuning signal based on the divided output signal and the reference signal, and tuning the output signal based on the tuning signal.

BRIEF DESCRIPTION OF THE DRAWINGS

The invention will become more fully understood from the following detailed description, taken in conjunction with the accompanying drawings, wherein like reference numerals refer to like elements, and in which.

DETAILED DESCRIPTION OF THE PREFERRED EMBODIMENTS

Figure 1:
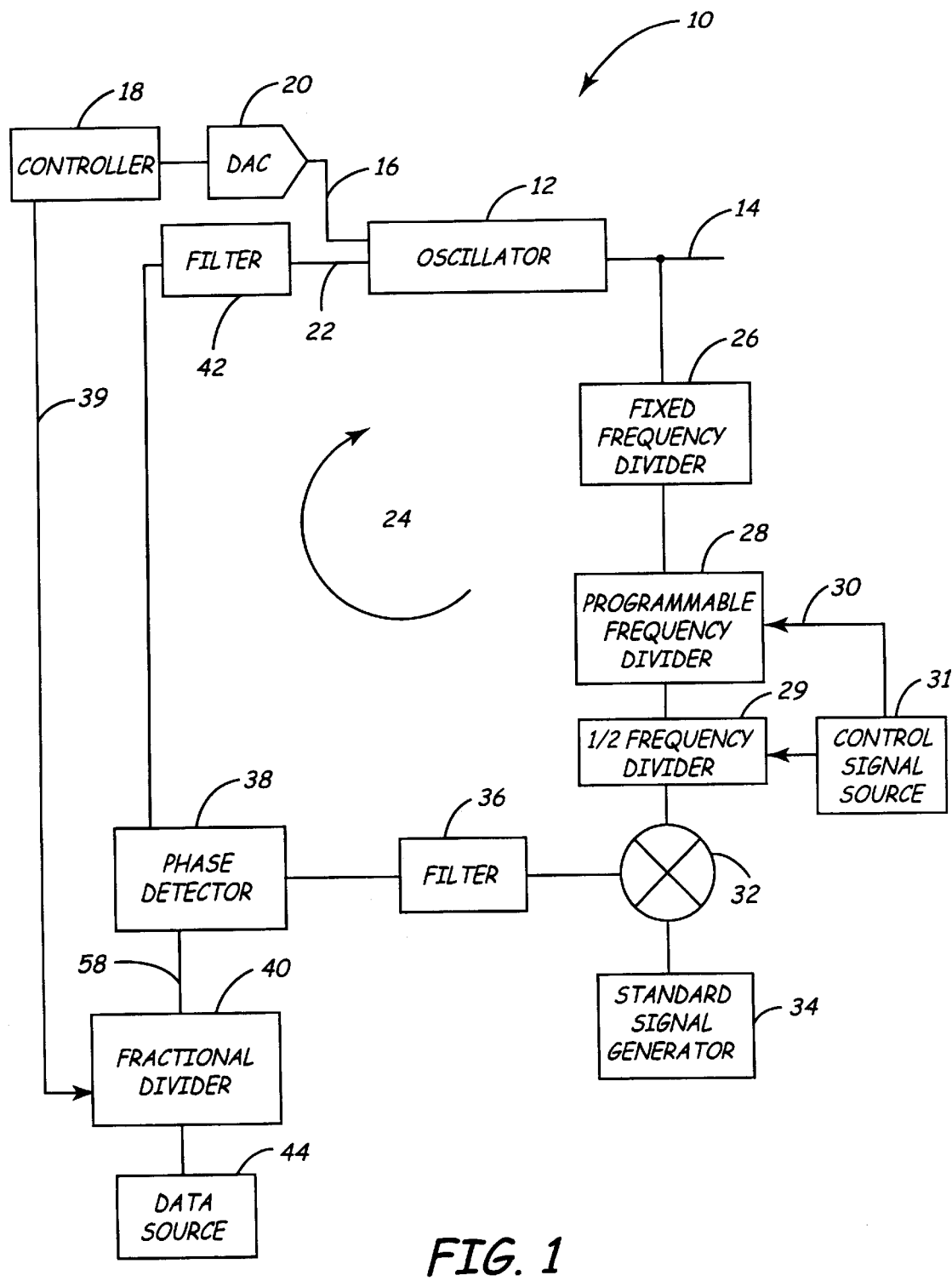
FIG. 1 is a general block diagram of a signal generator including a fractional divider according to an exemplary embodiment.

Referring first to FIG. 1, a microwave signal generator 10 according to an exemplary embodiment is shown. Signal generator 10 has particular advantages for microwave signal generation (i.e., in the range of 2.0 GHz to 250 Gigahertz (GHz)), but may also find applications in generating signals outside of the microwave range, including in the ultra high frequency (UHF) and very high frequency (VHF) ranges. Signal generator 10 is useful in exciters, frequency synthesizers, phase modulated transmitters, receiver local oscillators, etc. for such end uses as RF jammers, wireless communication systems, point-to-point data transmission system test equipment, and systems requiring high data rate analog and digital modulation at high frequencies.

In this exemplary embodiment, signal generator 10 is configured to produce an output signal on output line 14 having a frequency between approximately 2–8 GHz with tuning on the order of less than 1 Hertz (Hz) and integrated phase jitter of less than . 0.25° rms (integrated from 100 Hz to 20 Megahertz (MHz) offset from the carrier). Signal generator 10 includes an oscillator 12 configured to receive an input signal on input line 16 from a controller 18 through a digital-to-analog converter 20 (DAC). Controller 18 is configured to provide the input signal as a coarse, pre-tuning signal to oscillator 12. DAC 20 converts the input signal to a voltage suitable for use by oscillator 12. In this exemplary embodiment, oscillator 12 includes an Yttrium-Iron-Garnet (YIG)-tuned oscillator (YTO) configured to produce an output signal in response to the input signal. Oscillator 12 includes a main coil coupled to input line 16 and a frequency modulation (FM) coil, or fine-tuning terminal, coupled to tuning line 22. A YTO oscillator is chosen for its very low noise characteristics, though alternative embodiments may use other known oscillators, such as other tunable oscillators, voltage-controlled oscillators (VCO), etc.

Signal generator 10 also includes a phase locked loop 24 having various circuit elements configured to tune the output signal from oscillator 12 based on a tuning signal provided at tuning line 22. Phase locked loop 24 need not include every element described below to realize certain advantages of the present invention. In this exemplary embodiment, phase locked loop 24 includes a fixed frequency divider 26, a programmable frequency divider 28, a 1/2 frequency divider 29, a mixer 32, a filter 36, a phase detector 38 and a filter 42. Phase locked loop 24 down converts the output signal to a lower frequency to allow for the use of fewer microwave circuits, thereby reducing cost and complexity. Signal generator 10 provides the output signal to a fixed frequency divider 26. Fixed frequency divider 26 is configured to reduce the output signal, having a frequency on the order of 2 to 8 GHz, by a fixed division factor (e.g., a factor of two in this exemplary embodiment, though other division factors, including variable division factors, may be used in the alternative). Divider 26 is further configured to provide the resulting signal, now having a frequency between approximately 1 GHz and 4 GHz, to a programmable frequency divider 28. Programmable frequency divider 28 is operable up to 4 GHz. However, since future programmable frequency dividers may operate above 8 GHz, fixed frequency divider 26 may no longer be required.

Programmable frequency divider 28 is programmable via a control signal received on a control terminal 30 to divide the resulting signal by one of a range of division ratios, such as 11 to 31, to produce a divided signal having a frequency of between 89.375 MHz and 97.5 MHz. The control signal may be generated by controller 18, received from a non-volatile memory, or otherwise provided to programmable frequency divider 28 from a control signal source 31. Other ranges of division ratios may be implemented, depending in part on the frequency of the standard signal (described below), the operable frequency range of phase detector 38 (described below) and the desired frequency range of the output signal.

In this exemplary embodiment, fixed frequency divider 26 and programmable frequency divider 28 are capable of operating in the microwave region. One technology which enables this operation is the use of Gallium Arsenide (GaAs) Heterojunction Bipolar Transistors (HBT). An exemplary fixed, base-2 divider suitable for divider 26 at 12 GHz is the HMMC-3122 fixed divide by 2 divider manufactured by Hewlett-Packard, Palo Alto, Calif. Alternatively, other technologies for fixed or variable down converting of microwave, high frequency, or GHz-level input frequencies to lower frequencies, now known or later developed, may be implemented in dividers 26 and 28.

Programmable frequency divider 28 is a custom Application Specific Integrated Circuit (ASIC) manufactured by Rockwell Collins, Cedar Rapids, IA using a GaAs HBT process. The ASIC divides in integer steps from 4 to 31 and has a maximum input frequency of nearly 5 GHz. The ASIC has an input buffer stage, a divider stage, and an output buffer stage. The input buffer stage converts a nominal 0 dBm (Decibles referenced to milliwatts) single-ended input signal to a differential ECL (Emitter Coupled Logic) output signal. The input buffer stage has a gain of about 3, to increase rise time and improve noise performance.

Figure 2:
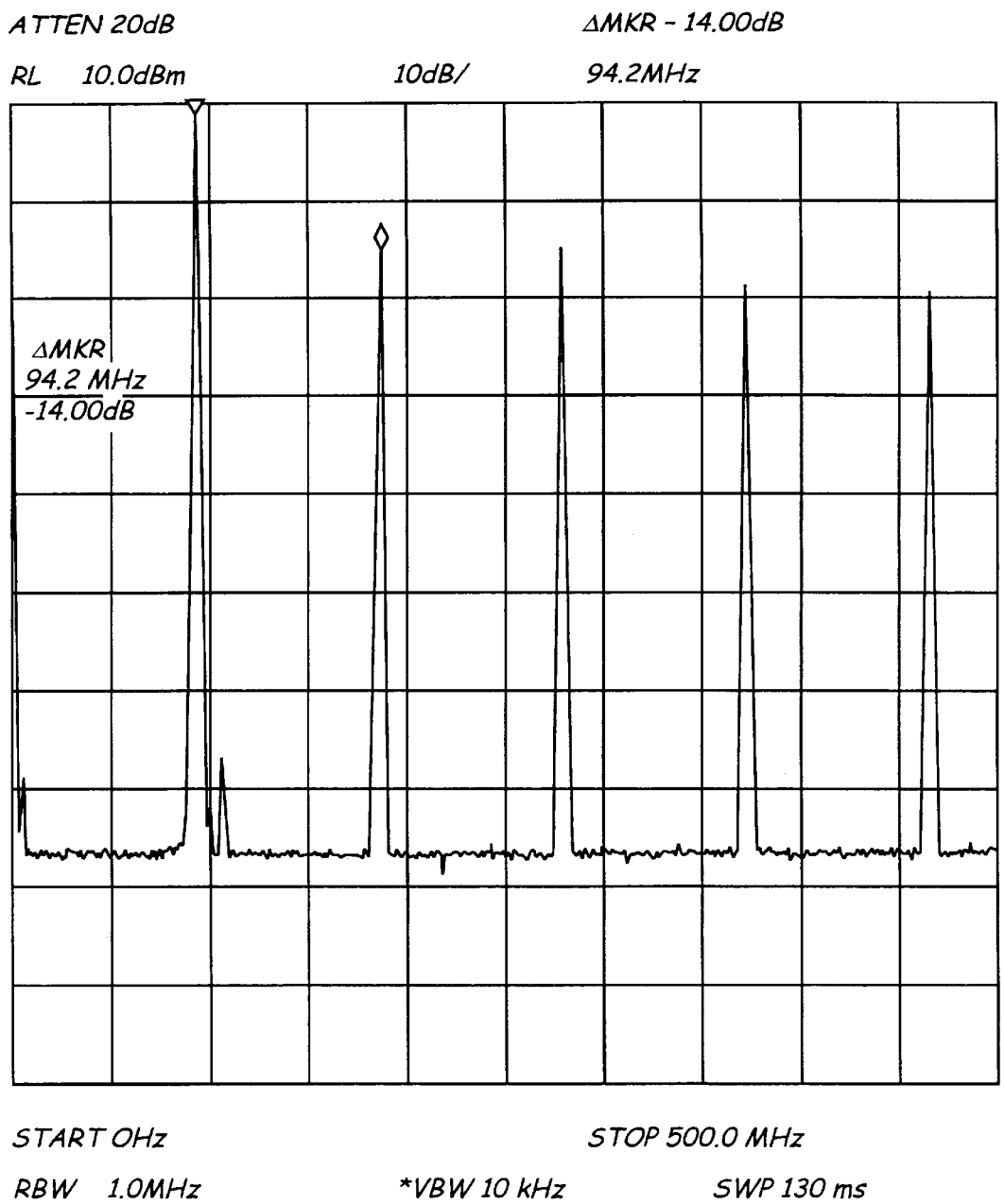
FIG. 2 is a graph of a divided signal generated by the programmable frequency divider illustrated in FIG. 1 according to an exemplary embodiment.

The divider stage generates any of a plurality of division ratios with small path delays while maintaining an approximately 50% duty ratio. For even division ratios, the duty ratio is exact. For odd division ratios, the duty cycle is within one count of 50%. For example, for a divide by 15, the output of the divider will be high for 8 counts and low for 7 counts. FIG. 2 shows a spectrum for an output of 1.4 GHz/15=93.3 MHz. The spectrum shows reasonable suppression of the even harmonics, indicating an output waveform approximating a square wave. The architecture of the second stage is disclosed in U.S. Pat. No. 5,987,089 issued Nov. 16, 1999 to Hawkins, Jr., which is herein incorporated by reference. The output buffer stage includes a high power buffer designed to drive 50 Ohms at a level of +13 dBm.

Figure 3:
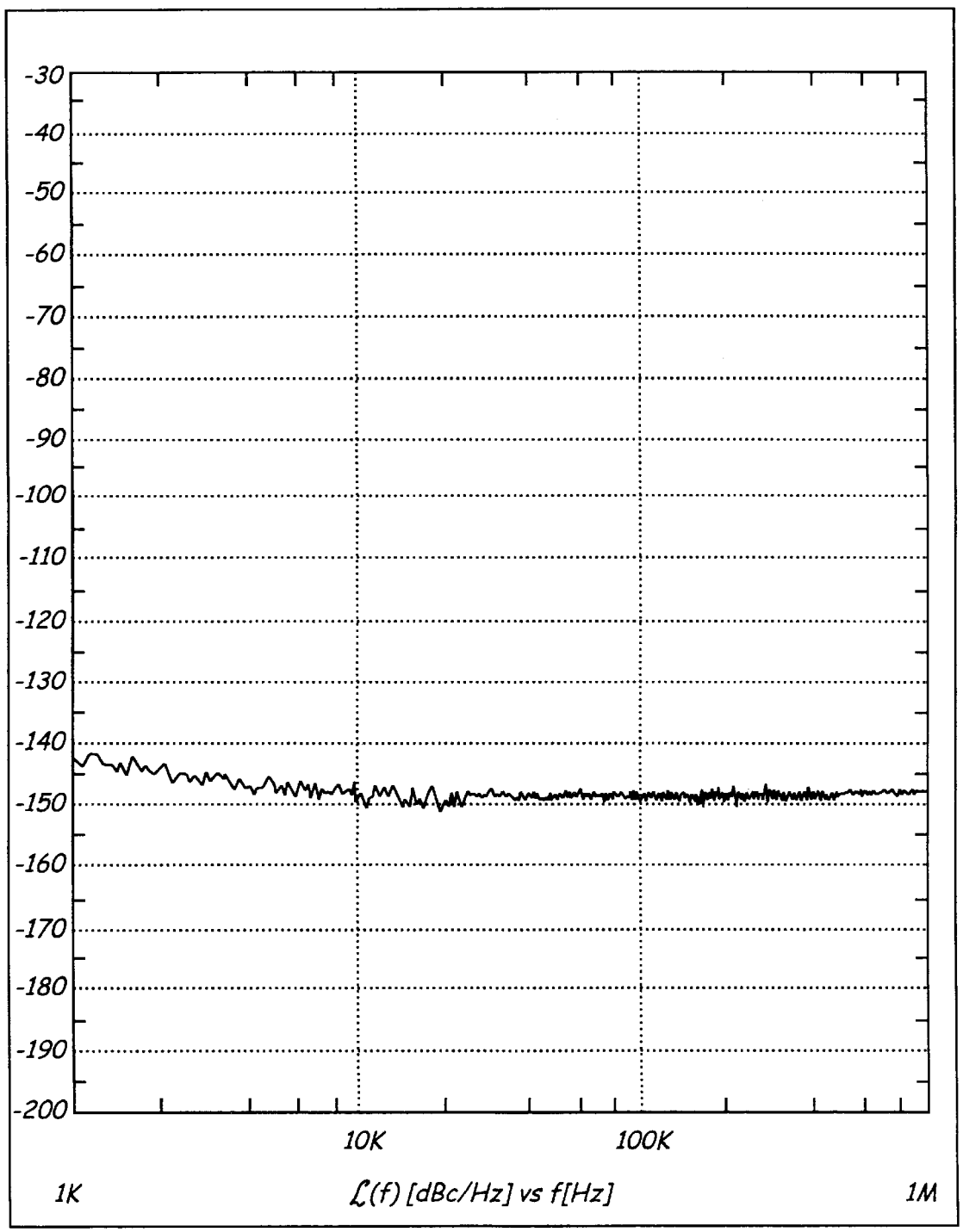
FIG. 3 is a residual phase noise plot for the programmable frequency divider illustrated in FIG. 1 according to an exemplary embodiment.

FIG. 3 shows a plot of the residual phase noise generated by programmable frequency divider 28 for a 2 GHz input signal and a 125 MHz output signal. The phase noise shown is actually the sum of two dividers placed in parallel. Thus, 3 dB must be subtracted to determine the noise of each divider. As is shown, the residual noise is approximately −150 dBc/Hz (Decibels referenced to the carrier signal) at 10 kHz offset (i.e., 10 kHz away from the desired divided signal).

Divider 28 provides the divided signal to a 1/2 frequency divider 29 which divides the divided signal again by 2, if desired, based on a control signal. The control signal may be generated by controller 18, received from a non-volatile memory, or otherwise provided to 1/2 frequency divider 29 from a control signal source 31. Thus, the total frequency division contributed by dividers 26, 28, and 29 in this exemplary embodiment may range from 8 to 124, though the actual range is between 22 and 82 based on the requirements of phase detector 38. Divider 29 provides the divided signal to a mixer 32 where the divided signal is mixed with a 100 MHz standard (i.e., low noise) signal generated by a standard signal generator 34 to produce a mixed signal in the intermediate frequency range, such as, between 2.5 MHz and 10.625 MHz. In this exemplary embodiment, the range of 2.5 MHz to 10.625 MHz is selected based on the optimal operating range of phase detector 38. One skilled in the art will recognize that other frequency ranges are possible. The mixed signal is provided through a filter 36 which rejects unwanted frequencies (e.g., the divided signal frequency between 89.375 MHz and 97.5 MHz, the 100 MHz standard signal, and other harmonics) by, for example, low pass filtering the mixed signal. The filtered signal is then provided to phase detector 38.

Phase detector 38 is a low noise phase/frequency detector configured to receive a reference signal generated by a fractional divider 40. Fractional divider 40 is outside PLL 24, meaning the output signal from oscillator 12 is not provided as an input signal to fractional divider 40 in this exemplary embodiment. Fractional divider 40 fractionally divides a high frequency clock signal to generate the reference signal having a frequency between 2.5 MHz and 10.625 MHz in response to a control signal received on line 39, as will be described in greater detail below with reference to FIG. 4. Phase detector 38 generates a tuning signal based on the comparison between the mixed signal and the reference signal, and provides the tuning signal through a filter 42 to tuning line 22 of oscillator 1 2. Filter 42 sets the time characteristics and noise characteristics for phase locked loop 24, including the loop bandwidth, as is known the art of phase locked loops.

The relationship between the frequency of the output signal of oscillator 12 ($f_{yto}$), the division ratio of divider 28 (N), and the frequency of the reference signal ($f_{mfd}$) is described by:

$$f_{yto}(MHz) = (100 - f_{mfd}(MHz)) \times N \times 2$$

Through proper selection of division ratio N and $f_{mfd}$, it is possible to synthesize all frequencies between 2 GHz and 8 GHz in sub-hertz steps with an upper division ratio of 82 and a lower reference frequency of 2.5 MHz.

Fractional divider 40 is used to allow signal generator 10 to provide very small (e.g., sub-Hertz) frequency steps in the output signal without producing discrete spurious signals. Any spurious levels or phase noise on the reference signal provided to phase detector 38 are increased by 20 log(N) at oscillator output 14, where N is the total down conversion division ratio created by the combination of dividers 26, 28 and 29. As mentioned previously, N=82 at 8 GHz. This results in a 38 dB increase in the spurious level and phase noise from the FM coil of oscillator 12 to the output signal of oscillator 12. Meeting a goal of −60 dBc spurious at the synthesizer output then requires the reference signal to have −98 dBc spurious. Conventional direct digital synthesizers (DDS) would not meet this requirement across the entire 2.5 MHz to 10.625 MHz reference frequency range. Accordingly, a sigma-delta modulated fractional divider is used to obtain the desired fine tuning and spurious noise shaping required. Alternatively, other dividers or reference signal sources which provide the desired fine tuning and spurious noise shaping may be used.

Figure 4:
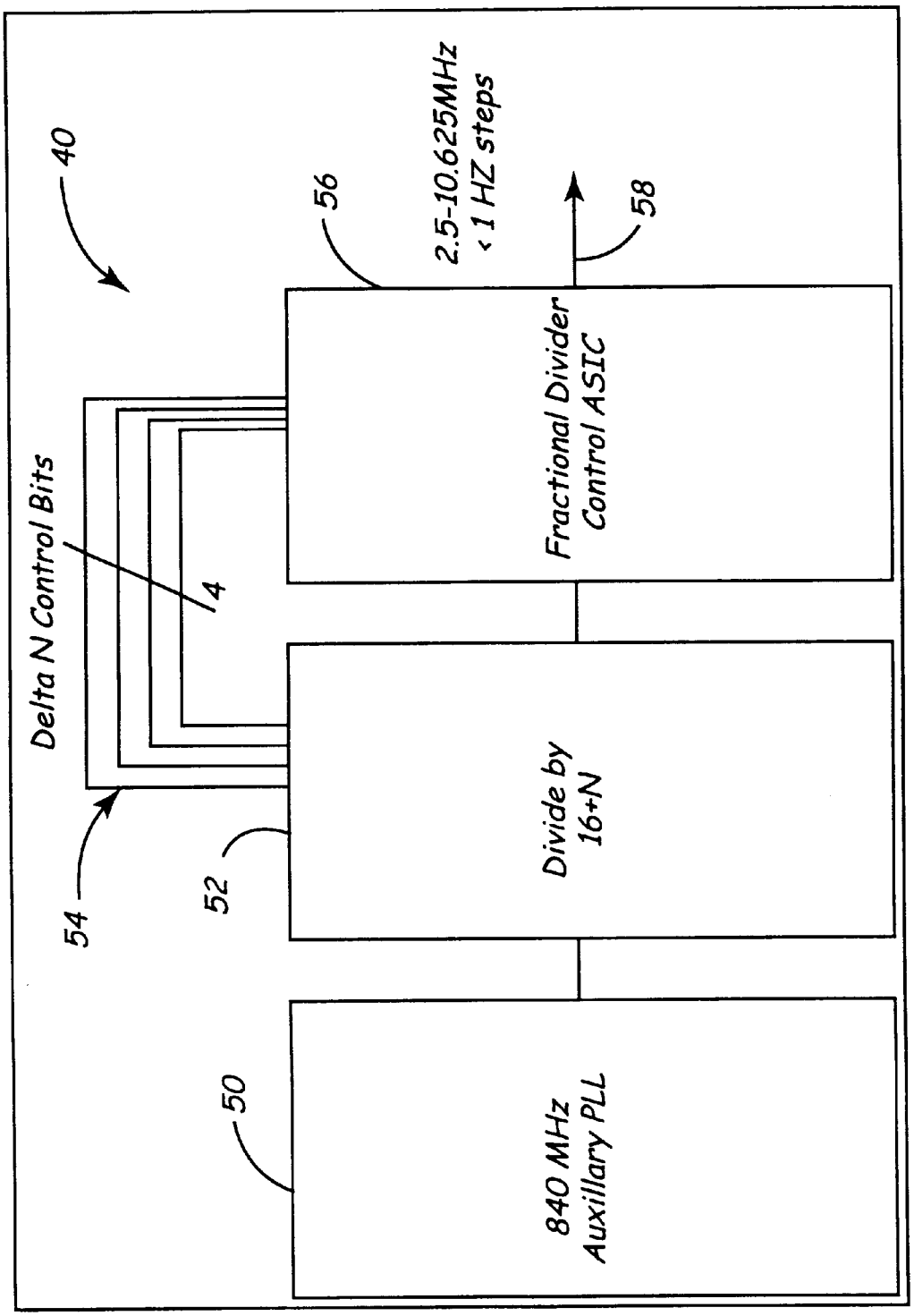
FIG. 4 is a block diagram of an exemplary fractional divider for use with the signal generator illustrated in a more detailed FIG. 1.

FIG. 4 is a block diagram of an exemplary fractional divider 40. This exemplary fractional divider 40 is a sigma-delta modulated fractional divider. While prior applications of sigma-delta modulated dividers have implemented a fractional divider within a PLL, fractional divider 40 is outside PLL 24, as shown in FIG. 1, in this exemplary embodiment. Sigma-delta modulated fractional divider 40 is configured to produce a high resolution tuning signal with a minimal amount of phase noise. Divider 40 generates a desired frequency with sub-hertz resolution and eliminates low frequency phase error by rapidly switching a division ratio of a clock signal. The clock signal is generated by a clock source 50 in the Ultra-High Frequency (UHF) range (e.g., having a frequency in the range of 300 to 3000 MHz), or 840 MHz in this example. Clock source 50 is an 840 MHz auxiliary PLL in this exemplary embodiment, which provides the clock signal to divider 52. Divider 52 is a multi-modulus divider which rapidly (e.g., at 840 MHz) divides the clock signal by a division ratio of 16+N. Divider 52 may be a 16+N Prescaler, Part No. 351-4094, manufactured by Rockwell Collins, Cedar Rapids, Iowa. N is an integer received via four control lines 54 from a pseudorandom integer generator in controller 56. Controller 56 may be a Fractional Divider ASIC, Part No. 351-4814, manufactured by Rockwell Collins, Cedar Rapids, Iowa. The output of divider 52 clocks controller 56 which provides a different integer N at each period of the reference signal provided on line 58. The high frequency of the output of divider 52 is desireable for maximizing the rapid switching of the division ratio of divider 52, since by changing the division ratio rapidly between different values, the phase errors occur in positive and negative polarities, and at high frequencies. The noise produced is then simply converted to a voltage by phase detector 38 and filtered out by a filter (e.g., a low pass filter), thereby producing a low-noise, fine resolution reference signal.

Naturally, the frequency of the clock signal generated by clock source 50 is constrained by the frequency optimal for phase detector 38. In this embodiment, phase detector 38 is configured to compare a reference signal having a range of 2.5 to 10.625 MHz to the mixed signal received from filter 36 having a frequency within a similar range. Optionally, signal generator 10 may include a data source 44 configured to provide a data signal (e.g., a frequency modulated signal, phase shift keying signal, or other type of data signal) to fractional divider 40. Fractional divider 40 is then configured to modulate the data signal onto the reference signal such that a data signal can be modulated onto the output signal provided at output line 14.

More specifically, divider 52 is a multi-modulus divider with a 4 stage sigma delta modulator and a 24-bit accumulator. The multi-modulus divider is configured to divide by any value between N−7 and N+8. Controller 56 (e.g., an ASIC in this exemplary embodiment) causes the division ratio to vary in a random fashion, producing pure noise. The output frequency of fractional divider 40 ($f_{mfd}$) is given by the equation:

$$f_{mfd}(MHz) = (840 \times 10^6) \times 2^{24} / M$$

Where M is a 32-bit number received via a control signal, the 32-bit number corresponding to a division ratio having an 8-bit integer value and a 24-bit fractional value for the counter. The control signal may be generated by controller 18, received from a non-volatile memory, or otherwise provided to fractional divider 40 from a control signal source 31.

Figure 5:
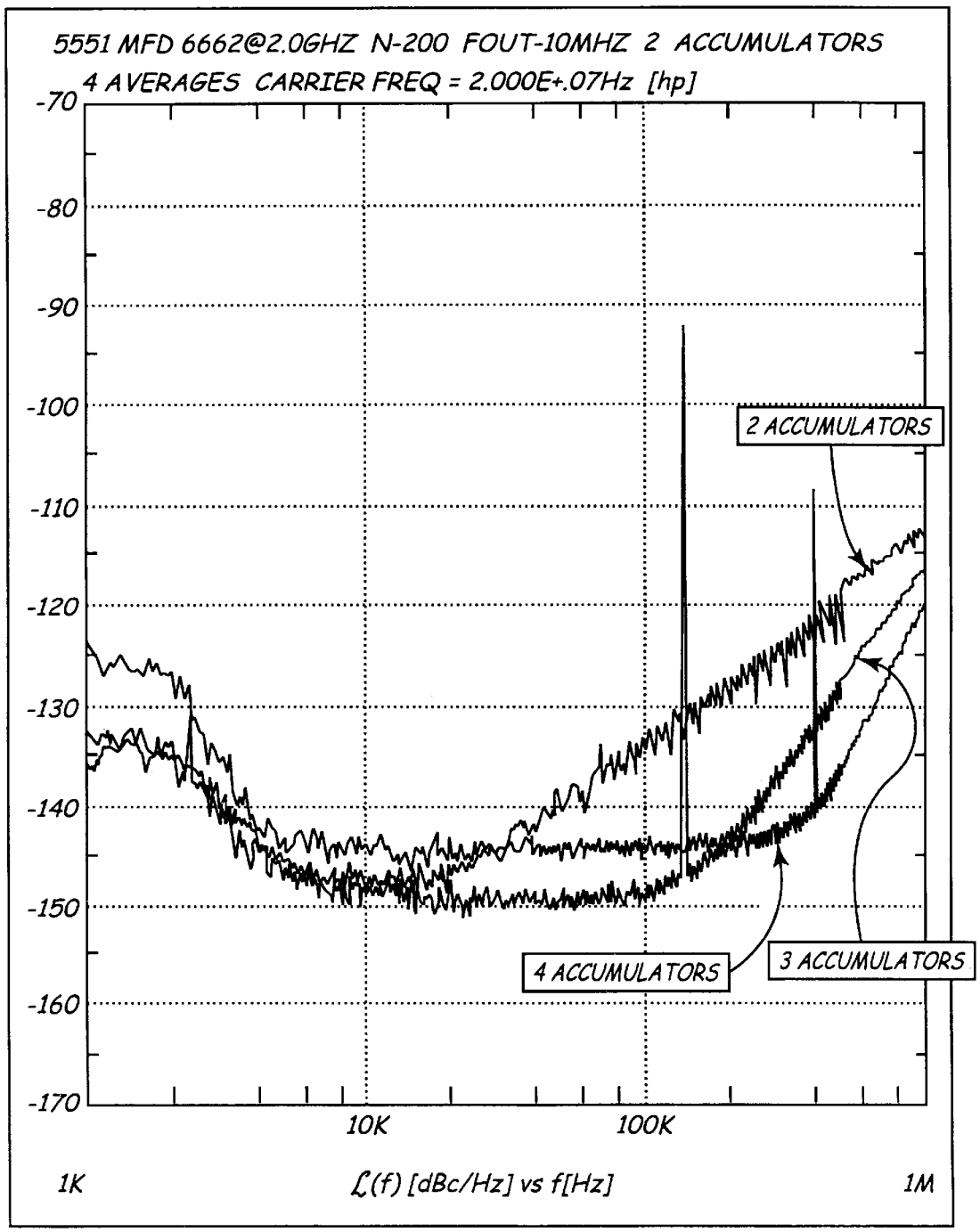
FIG. 5 depicts several phase noise plots of a fractional divider, each plot representing a different number of accumulators in the fractional divider.

Noise power rises rapidly with offset frequency. FIG. 5 shows a plot of the noise shaping present on a 10 MHz reference signal generated by fractional divider 40 having different accumulator sizes. Proper selection of reference signal frequency and loop filter bandwidth are required to produce the final desired phase noise performance, as will now be described.

Figure 6:
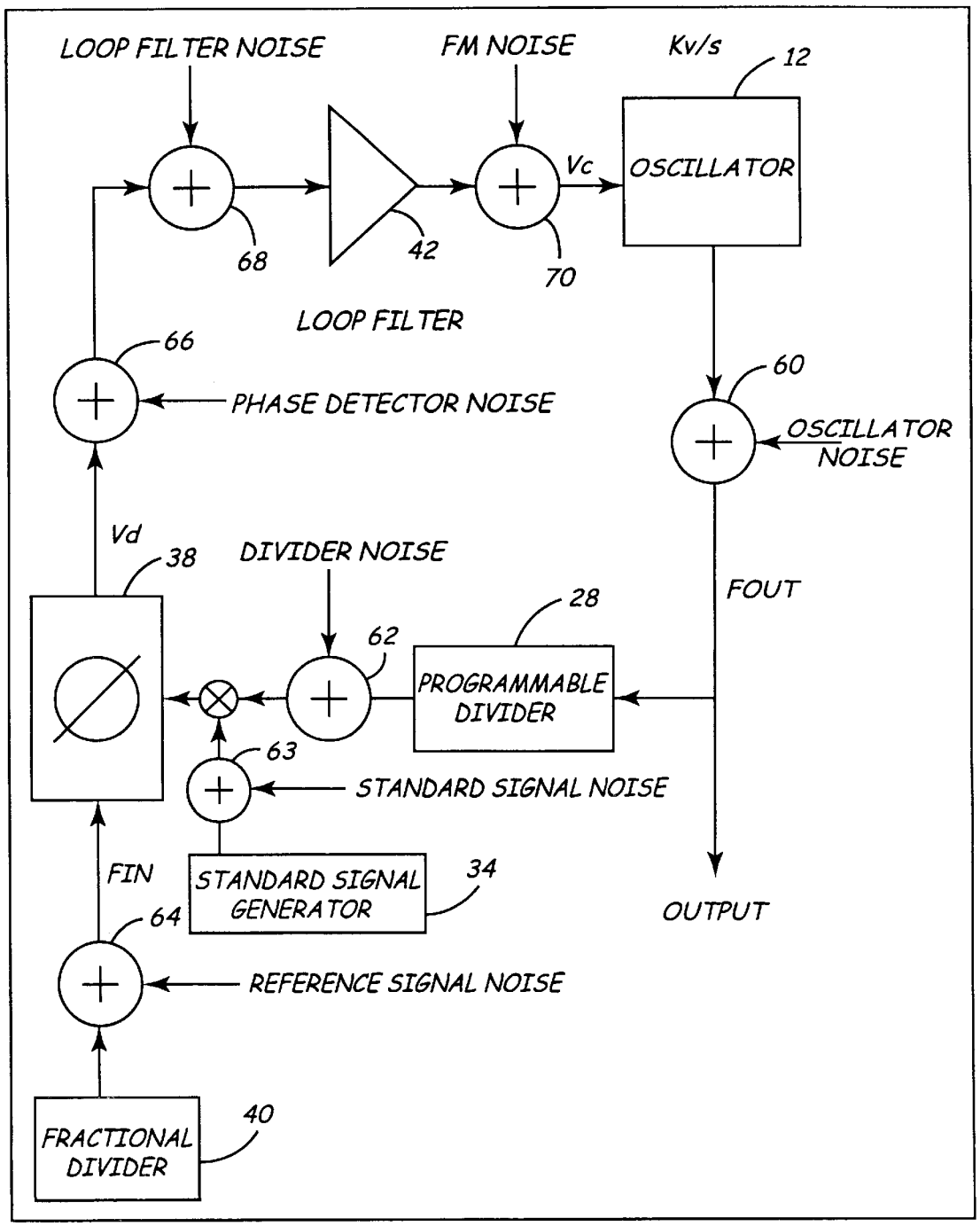
FIG. 6 is a noise model showing individual sources of noise within a signal generator according to an exemplary embodiment.
Figure 7:
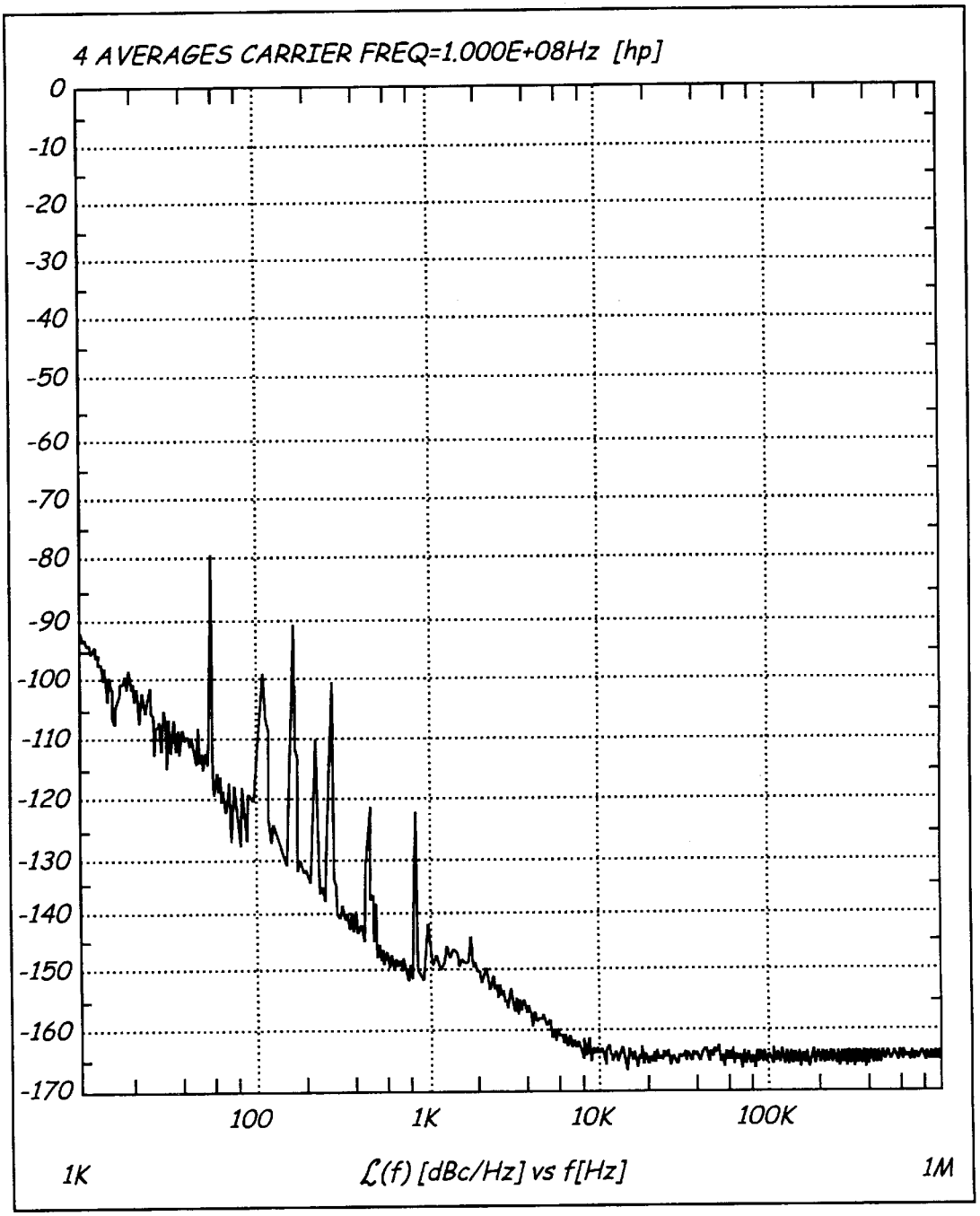
FIG. 7 is a graph showing phase noise resulting from a standard signal generator according to an exemplary embodiment.
Figure 8:
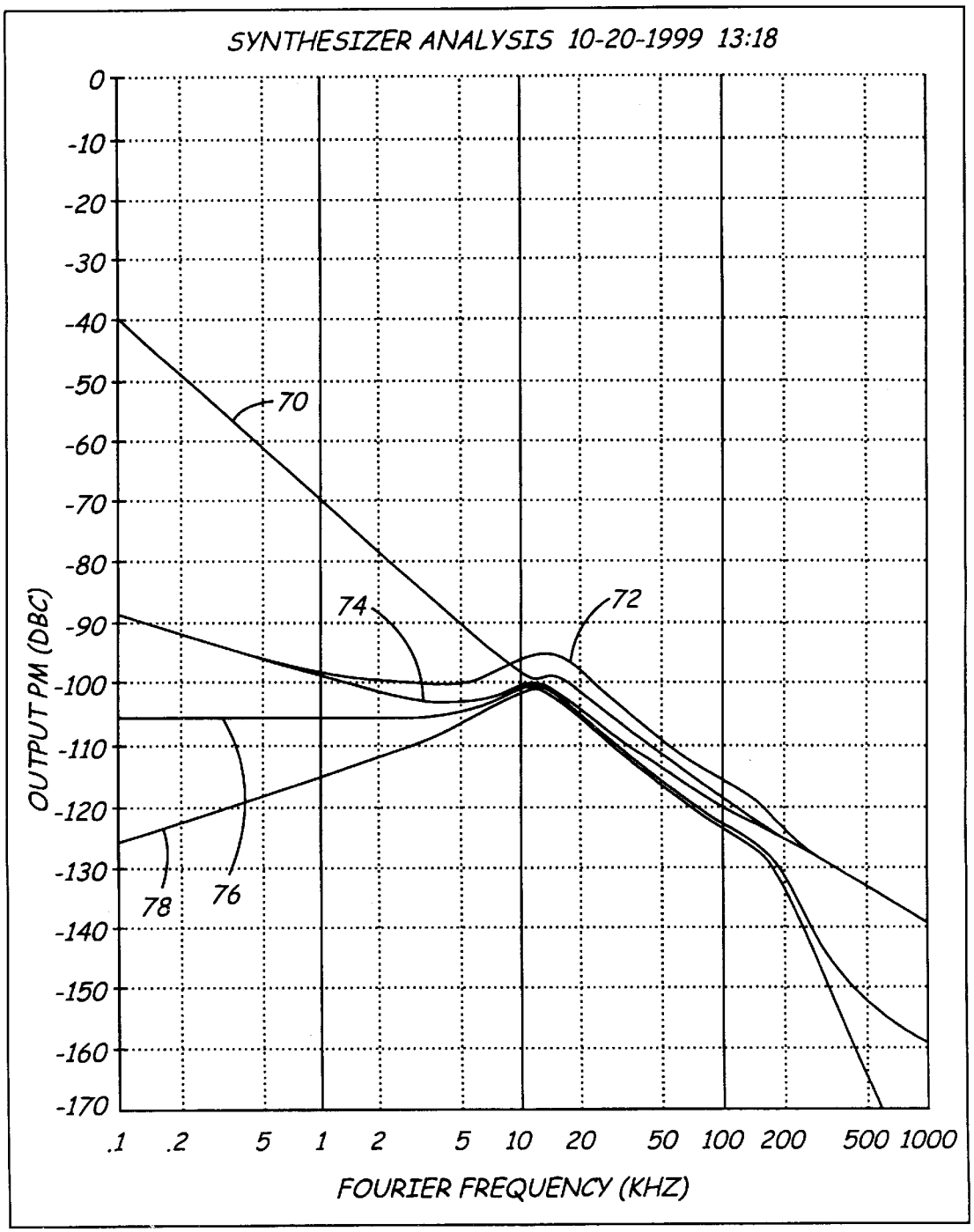
FIG. 8 is a simulated graph of the phase noise of a signal generator according to an exemplary embodiment.
Figure 9:
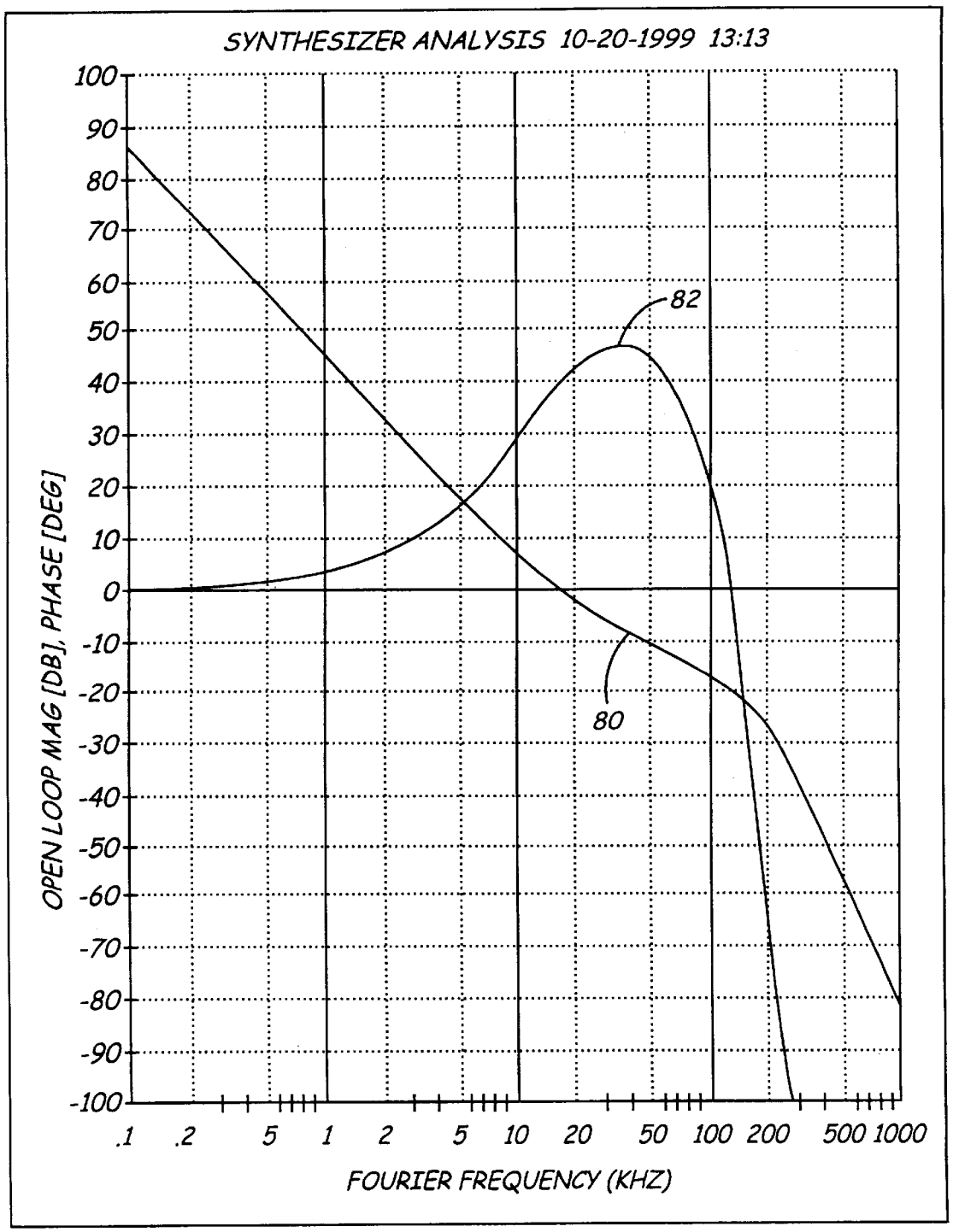
FIG. 9 is a graph of the simulated open loop response.

FIG. 6 discloses a noise model showing individual sources of noise within signal generator 10. Each source of noise arises from a different mechanism. All of the noise sources can be measured and evaluated. The goal is to select the loop filter bandwidth in filter 42 for optimal phase noise. Oscillator 12 produces oscillator noise 60; programmable divider 28 produces divider noise 62; standard signal generator 34 produces standard signal noise 63; fractional divider 40 produces reference signal noise 64; phase detector 38 produces phase detector noise 66; loop filter 42 produces loop filter noise 68; and the FM coil of oscillator 12 produces FM noise 70. FIG. 7 is a plot showing phase noise resulting from standard signal generator 34 using a two-source method (i.e., 3 dB must be subtracted to determine the phase noise from one standard signal generator). FIG. 8 is a simulated plot of the phase noise of the YIG oscillator 70, total closed loop noise at the output signal 72, composite noise from dividers 26, 28, and 40 74, noise from an op-amp in loop filter 42 76, and FM noise 70. Plotting these sources of noise together reveals that approximately 16.4 KHz is an optimum frequency at which to set the loop filter band width in filter 42 for optimal phase noise. The simulated open loop response is shown in FIG. 9, in which the open loop gain 80 is plotted with the open loop phase 82.

Advantageously, the only microwave circuits required for the exemplary embodiment are a printed microstrip splitter at the output of oscillator 12 to split the output signal between the output of the system and phase locked loop 24, a low cost GaAs HBT Monolithic Microwave IC (MMIC) (not shown, but located before divider 26 in FIG. 1), and dividers 26 and 28. After divider 28, PLL 24 includes relatively inexpensive Very High Frequency (VHF) components, which can be produced with Standard Measurement Techniques (SMT) and simple shielding.

EXAMPLE

According to one example, an output frequency of 5.99895 GHz is desired. Oscillator 12 is a YTO and is pre-tuned to 5.99895 GHz +/−50 MHz via an input signal provided by controller 18 (e.g., a microprocessor) through DAC 20 to the YIG main coil. The output signal is divided by two by fixed GaAs HBT divider 26 to produce a resulting signal having a frequency of approximately 3.0 GHz +/−25 MHz. The resulting frequency is provided to programmable GaAs HBT divider 28 being programmed to divide by 31 by controller 18. The divided signal generated by programmable divider 28 has a frequency ($f_{div}$) of:

$$f_{div} = f_{yto}/2/31$$
$$= 96.75 \text{ MHz } +/- \approx 0.8 \text{ MHz}$$

The divided signal is then mixed via mixer 32 with a 100 MHz standard signal to produce a mixed signal having a frequency of 3.25 MHz, which is compared via phase detector 38 with a low noise 3.25 MHz reference signal derived from modulated fractional divider 40. Phase detector 38 generates a tuning signal which is converted to a current via filter 42 and applied to the FM coil of YTO 12 to lock YTO.

Figure 10:
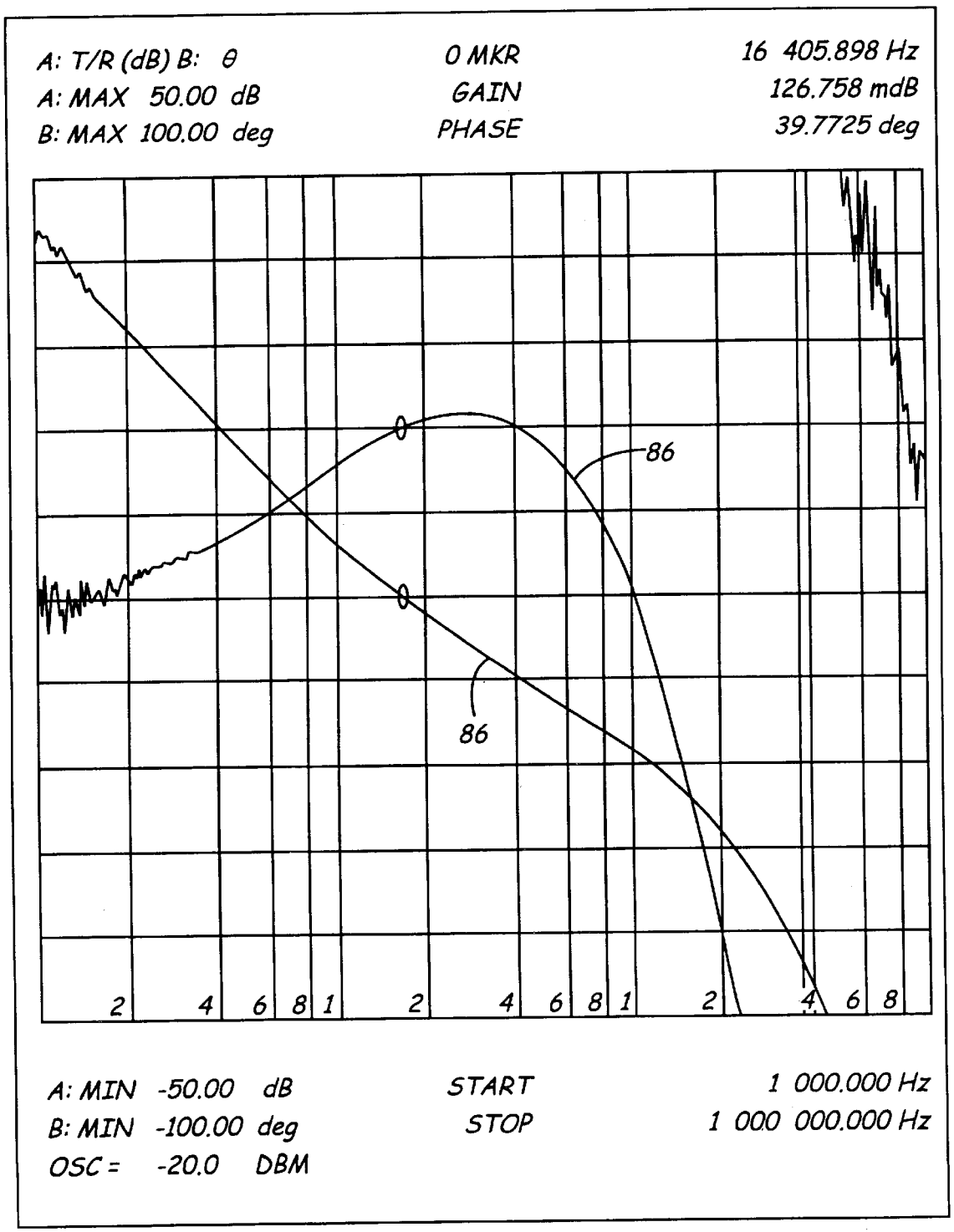
FIG. 10 is a graph showing the measured open loop gain and open loop phase of a signal generator according to an exemplary embodiment.
Figure 11:
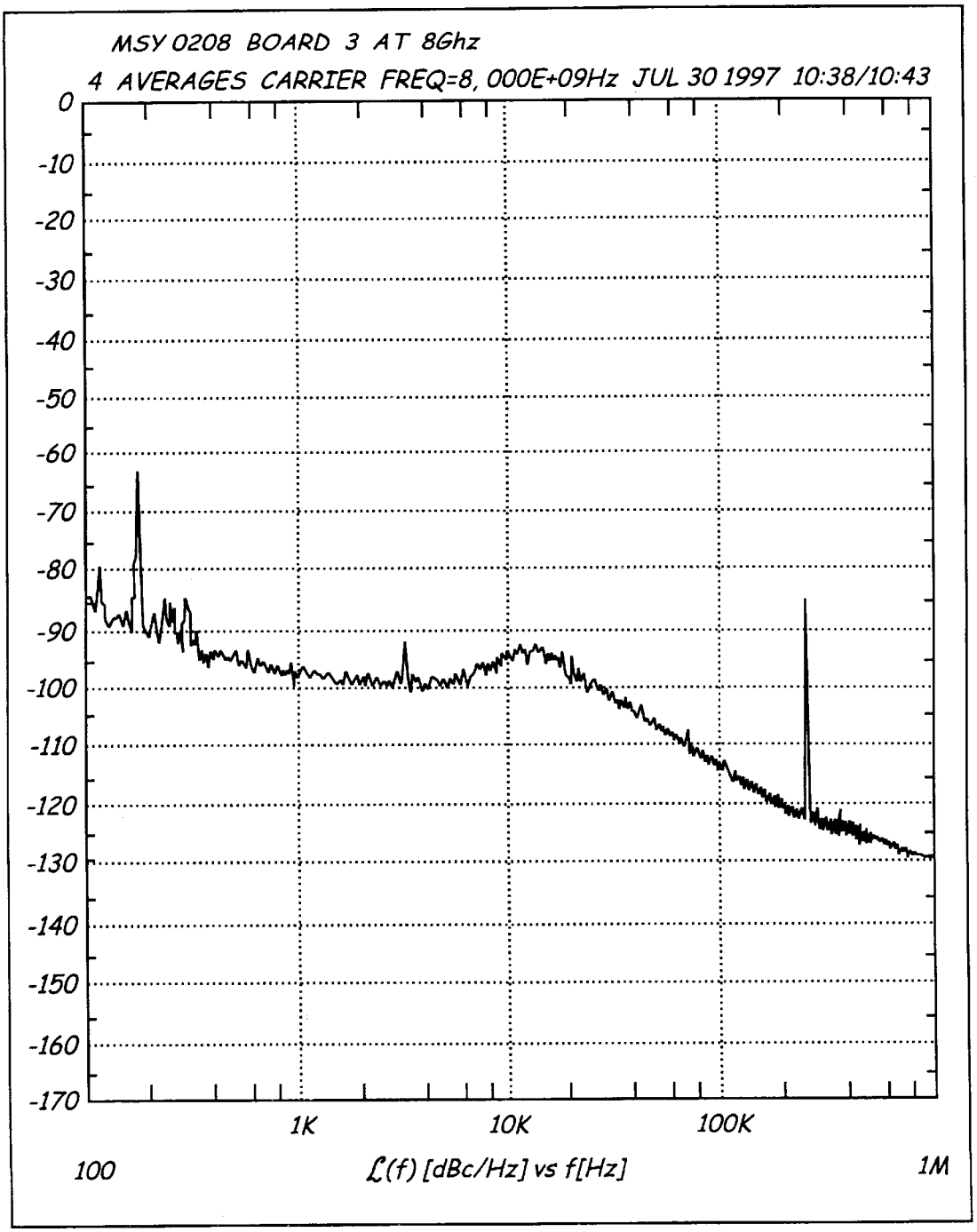
FIG. 11 is a graph showing the measured phase noise of a signal generator according to an exemplary embodiment.

In this example, the phase noise of the signal generator was measured with a HP 11740A microwave Phase Noise Measurement System. Gain/phase measurements were made using a HP 4194A Impedance/Gain-Phase Analyzer and a Bode measuring circuit test fixture. FIG. 10 shows the measured open loop gain 84 and open loop phase 86 of the completed signal generator at 8.0 GHz. FIG. 11 shows the measured phase noise of the completed signal generator at 8.0 GHz. Note the close agreement between the measured, actual analysis of FIGS. 10, 11 and the simulated, predicted analysis of FIGS. 8, 9.

The measured jitter for the signal generator is calculated by integrating the open loop response, and is shown in Table 1 below for various tuned frequencies.

TABLE 1

| Signal Generator Frequency | Measured Jitter (100 Hz to 20 MHZ) |
|---|---|
| 2 GHz | .173° rms |
| 3 GHZ | .177° rms |
| 4 GHz | .183° rms |
| 5 GHz | .206° rms |
| 6 GHz | .223° rms |
| 7 GHz | .252° rms |
| 8 GHz | .286° rms |

While the embodiments illustrated in the FIGURES and described above are exemplary, it should be understood that these embodiments are offered by way of example only. For example, the frequencies, integers, implementation technologies (e.g., YTO, HBT, GaAs, etc.) are merely exemplary and are not intended to be construed as limitations on the scope of the claims. The invention is not limited to a particular embodiment, but extends to various modifications that nevertheless fall within the scope of the appended claims.

What is claimed is:

1. A signal generator for providing a data signal on an output signal, comprising:

an oscillator configured to provide the output signal;
a phase locked loop configured to receive the output signal and to provide a tuning signal to the oscillator, the phase locked loop further comprising:
a frequency divider configured to receive the output signal, to divide the output signal, and to provide a divided output signal;
a mixer configured to mix the divided output signal with a standard signal and to provide a mixed signal;
a phase detector configured to receive the mixed signal, to compare the mixed signal to a reference signal, and to provide the tuning signal to the oscillator based on the comparison; and
a fractional divider outside of the phase locked loop configured to receive the data signal, to modulate the data signal on to the reference signal, and to provide the reference signal to the phase detector, wherein the data signal is modulated onto the output signal.

2. The signal generator of claim 1, wherein the frequency divider is configured to receive a control signal, to select one of a plurality of division ratios based on the control signal, and to generate the divided output signal based on the selected division ratio.

3. The signal generator of claim 2, further comprising a second frequency divider configured to divide the output signal by a fixed division ratio and to provide the resulting signal to the frequency divider.

4. The signal generator of claim 3, wherein at least one of the frequency divider and second frequency divider includes a heterojunction bipolar transistor (HBT).

5. The signal generator of claim 1, wherein the oscillator includes a main coil and a fine tune coil, the oscillator configured to receive the tuning signal on the fine tune coil.

6. The signal generator of claim 5, wherein the oscillator is a YIG oscillator.

7. The signal generator of claim 5, further comprising a controller configured to provide an input signal to the main coil.

8. The signal generator of claim 1, wherein the fractional divider includes a sigma delta modulated fractional divider.

9. The signal generator of claim 1, wherein the oscillator is configured to provide the output signal with a frequency of between 2 and 8 Gigahertz.

10. The signal generator of claim 1, wherein the fractional divider and phase detector are configured to provide a tuning signal to the oscillator having a resolution of approximately one hertz or less.

11. The signal generator of claim 2, wherein the oscillator is configured to provide the output signal in the microwave range.

12. The signal generator of claim 1, wherein the phase locked loop includes only one mixer and no multipliers.

13. A microwave signal generator, comprising:
   an oscillator configured to receive a coarse tuning signal and to provide a microwave output signal; and
   a phase locked loop configured to receive the microwave output signal and to provide a fine tuning signal to the oscillator, the phase locked loop including:
      a programmable frequency divider configured to receive the microwave output signal and a control signal, to select one of a plurality of division ratios based on the control signal, and to generate a divided output signal based on the selected division ratio;
      a mixer configured to mix the divided output signal; and
      a phase detector configured to receive the mixed signal and a reference signal, to compare the mixed signal to the reference signal, and to provide the fine tuning signal to the oscillator based on the comparison.

14. The microwave signal generator of claim 13, wherein the mixed signal has a frequency between approximately 2.5 MHz and 100 MHz.

15. The microwave signal generator of claim 13, further comprising a second frequency divider configured to divide the microwave output signal by a fixed division ratio and to provide the resulting signal to the programmable frequency divider.

16. The microwave signal generator of claim 15, wherein the programmable frequency divider includes a heterojunction bipolar transistor (HBT).

17. The microwave signal generator of claim 13, wherein the oscillator is a YIG oscillator.

18. The microwave signal generator of claim 13, further comprising a controller configured to generate the control signal.

19. The microwave signal generator of claim 13, further comprising a modulated fractional divider configured to provide the reference signal.

20. The microwave signal generator of claim 19, further comprising a signal source configured to provide a data signal, wherein the modulated fractional divider is configured to modulate the data signal onto the reference signal.

21. The microwave signal generator of claim 13, further comprising a modulated fractional divider outside the phase locked loop configured to provide the reference signal.

22. A signal generator, comprising:
   means for providing an output signal in the microwave range;
   means for dividing the microwave output signal based on a control signal;
   means for mixing the divided output signal with a standard signal and for providing a mixed signal;
   means for generating a reference signal;
   means for generating a tuning signal based on the mixed signal and the reference signal; and
   means for tuning the output signal based on the tuning signal.

23. The signal generator of claim 22, wherein the output signal is between 2 and 8 GigaHertz.

24. The signal generator of claim 22, further comprising means for dividing the microwave output signal by a fixed division ratio.

25. The signal generator of claim 22, wherein the means for dividing includes a heterojunction bipolar transistor (HBT).

26. The signal generator of claim 22, wherein the means for providing includes an oscillator having a main coil and a fine tune coil, the oscillator configured to receive the tuning signal on the fine tune coil.

27. The signal generator of claim 22, wherein the means for generating a reference signal includes a sigma delta modulated fractional divider.

28. The signal generator of claim 22, further comprising means for modulating a data signal onto the reference signal.

29. The signal generator of claim 22, wherein the means for mixing includes only one mixer and the signal generator includes no multipliers.

30. A method of generating an output signal having fine resolution and low phase noise comprising:
   generating an output signal having a frequency between 2 and 8 gigahertz and an integrated phase jitter of less than 0.25° root mean square;
   dividing the output signal based on a control signal;
   mixing the divided output signal with a standard signal;
   generating a reference signal using a modulated fractional divider;
   generating a tuning signal based on the divided output signal and the reference signal to provide tuning on the order of less than 1 hertz; and
   tuning the output signal based on the tuning signal.

31. The method of claim 30, wherein the output signal is a microwave signal.

32. The method of claim 30, wherein the step of generating the reference signal includes sigma delta modulated fractional division.

33. The method of claim 30, wherein the output signal is in the microwave range.

* * * * *